(12) United States Patent
Allen et al.

(10) Patent No.: US 9,099,471 B2
(45) Date of Patent: Aug. 4, 2015

(54) SEMICONDUCTOR DEVICE CHANNELS (71) Applicant: International Business Machines Corporation, Armonk, NY (US)

(72) Inventors: David H. Allen, Rochester, MN (US); Douglas M Dewanz, Rochester, MN (US); David P. Paulsen, Dodge Center, MN (US); John E. Sheets, II, Zumbrota, MN (US); Kelly L. Williams, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/795,721

(22) Filed: Mar. 12, 2013

(65) Prior Publication Data

US 2014/0264942 A1 Sep. 18, 2014

(51) Int. Cl.
*H01L 23/48* (2006.01)
*H01L 23/528* (2006.01)
*H01L 23/00* (2006.01)

(52) U.S. Cl.
CPC ........ *H01L 23/5283* (2013.01); *H01L 23/5286* (2013.01); *H01L 24/64* (2013.01)

(58) Field of Classification Search
CPC .. H01L 23/5283; H01L 24/64; H01L 23/5286
USPC ......................... 257/775, 773, 734
See application file for complete search history.

(56) References Cited

U.S. PATENT DOCUMENTS

| 5,663,677 | A | 9/1997 | Freyman et al. |
| 5,726,499 | A | 3/1998 | Irinoda |
| 6,091,154 | A | 7/2000 | Ohkawa |
| 6,407,455 | B1 | 6/2002 | Wald et al. |

(Continued)

FOREIGN PATENT DOCUMENTS

| CN | 101673311 A | 3/2010 |
| CN | 201910624 U | 7/2011 |
| KR | 1020110002749 A | 1/2011 |

OTHER PUBLICATIONS

Allen et al., "Multiple-Patterned Semiconductor Device Channels", filed Mar. 11, 2013.

(Continued)

*Primary Examiner* — Long Pham
(74) *Attorney, Agent, or Firm* — Peder M. Jacobson; Robert R. Williams (57) ABSTRACT

A semiconductor device and a method of manufacture are provided. The semiconductor device includes one or more layers having channels adapted to carry signals or deliver power. The semiconductor device may include a signal channel and a power channel. The power channel may include power channel cross-sectional portions. A first conductor in the power channel may have a first cross-sectional area. A second conductor in the signal channel may have a second cross-sectional area. The second cross-sectional area may be smaller than the first cross-sectional area. The method of manufacture includes establishing a signal conductor layer including a signal channel and a power channel, introducing a first conductor in the power channel having a first cross-sectional area, and introducing a second conductor in the signal channel having a second cross-sectional area where the second cross-sectional area is smaller than the first cross-sectional area.

20 Claims, 10 Drawing Sheets

(56) References Cited

U.S. PATENT DOCUMENTS

| | | |
|---|---|---|
| 6,498,069 B1 | 12/2002 | Grivna |
| 7,268,434 B2 | 9/2007 | Nakashima |
| 7,648,900 B2 | 1/2010 | Kirby |
| 8,404,535 B2 | 3/2013 | Yu et al. |
| 2001/0036734 A1 | 11/2001 | Gris |
| 2001/0038137 A1 | 11/2001 | Akram |
| 2001/0054764 A1 | 12/2001 | Nitta et al. |
| 2001/0055840 A1 | 12/2001 | Verret |
| 2002/0019100 A1 | 2/2002 | Shukuri et al. |
| 2002/0039836 A1 | 4/2002 | Venkatesan et al. |
| 2002/0055230 A1 | 5/2002 | Chang |
| 2002/0076900 A1 | 6/2002 | Park et al. |
| 2002/0185684 A1 | 12/2002 | Campbell et al. |
| 2003/0022422 A1 | 1/2003 | Torii et al. |
| 2003/0151099 A1 | 8/2003 | Yoshiyama et al. |
| 2003/0183877 A1 | 10/2003 | Yagishita et al. |
| 2006/0012052 A1 | 1/2006 | McDevitt et al. |
| 2006/0097397 A1 | 5/2006 | Russell |
| 2006/0189137 A1 | 8/2006 | Anderson et al. |
| 2007/0222082 A1 | 9/2007 | Sonohara et al. |
| 2007/0264812 A1 | 11/2007 | Lung |
| 2007/0273044 A1 | 11/2007 | Yang et al. |
| 2008/0029834 A1 | 2/2008 | Sell |
| 2008/0283960 A1 | 11/2008 | Lerner |
| 2010/0301486 A1 | 12/2010 | Frohberg et al. |
| 2011/0001168 A1 | 1/2011 | Ko et al. |
| 2011/0014786 A1 | 1/2011 | Sezginer et al. |
| 2011/0070739 A1 | 3/2011 | Cheng et al. |
| 2011/0115047 A1 | 5/2011 | Hebert et al. |
| 2011/0147936 A1 | 6/2011 | Chu et al. |
| 2011/0217838 A1 | 9/2011 | Hsieh et al. |
| 2011/0227232 A1 | 9/2011 | Bonilla et al. |
| 2011/0281410 A1 | 11/2011 | Liu et al. |
| 2011/0291292 A1 | 12/2011 | Frohberg et al. |
| 2012/0110521 A1 | 5/2012 | Agarwal et al. |
| 2012/0161889 A1 | 6/2012 | Ozawa et al. |
| 2012/0299188 A1 | 11/2012 | Chen et al. |
| 2013/0003108 A1 | 1/2013 | Agarwal et al. |
| 2013/0007674 A1 | 1/2013 | Abou Ghaida et al. |
| 2013/0043556 A1 | 2/2013 | Horak et al. |
| 2013/0061183 A1 | 3/2013 | Abou Ghaida et al. |
| 2013/0061185 A1 | 3/2013 | Abou Ghaida et al. |
| 2013/0334610 A1 | 12/2013 | Moroz et al. |

OTHER PUBLICATIONS

Allen et al., "Semiconductor Device Channels", filed Mar. 11, 2013, U.S. Appl. No. 13/795,386.

Sapatnekar, S., et al. "Analysis and Optimization of Power Grids", IEEE, Design & Test of Computers. Published May-Jun. 2003, vol. 20 Issue 3, pp. 7-15, © 2003 IEEE.

Mirsaeedi, M., et al., "A statistical yield optimization framework for interconnect in double patterning lithography", Nov. 2011. Microelectronics Journal, vol. 42, Issue 11, pp. 1231-1238.

Mirsaeedi, M., et al., "Overlay-aware interconnect yield modeling in double patterning lithography", Jun. 2-4, 2010, IEEE International Conference on IC Design and Technology (ICICDT), pp. 138-141.

Yang, J. et al., "Overlay aware interconnect and timing variation modeling for Double Patterning Technology", Nov. 10-13, 2008, IEEE/ACM International Conference on Computer-Aided Design, ICCAD 2008, pp. 488-493.

Chen, E., "III. Wet and Dry Etching", Apr. 12, 2004. Applied Physics 298r. pp. 1-18.

```
Establishing a signal conductor
layer having a signal channel and a
power channel, the power channel
comprising a first power channel
cross-sectional portion and a second
power channel cross-sectional
portion, the first power channel
cross-sectional portion and the
signal channel having a same cross-
sectional area

210
```

↓

```
Introducing a first conductor in the
power channel having a first cross-
sectional area

220
```

↓

```
Introducing a second conductor in
the signal channel having a second
cross-sectional area, the second
cross-sectional area smaller than the
first cross-sectional area

SEMICONDUCTOR DEVICE CHANNELS

TECHNICAL FIELD

This disclosure relates generally to a semiconductor device and, more particularly, relates to signal integrity and power delivery of a semiconductor device.

BACKGROUND

The semiconductor industry is producing more and more capable components with smaller and smaller feature sizes. The production of such semiconductor devices reveals new design and manufacturing challenges to be addressed in order to maintain or improve semiconductor device performance. Simultaneously having semiconductor wiring stacks with high density, high yield, good signal integrity as well as suitable power delivery may present challenges.

SUMMARY

In an embodiment, this disclosure relates to a semiconductor device. The semiconductor device may include one or more layers. The semiconductor device may include channels adapted to carry signals or deliver power. The semiconductor device may include a signal channel and a power channel. The power channel may include a first power channel cross-sectional portion and a second power channel cross-sectional portion. The first power channel cross-sectional portion and the signal channel may have a substantially equivalent cross-sectional area. A first conductor in the power channel may have a first cross-sectional area. A second conductor in the signal channel may have a second cross-sectional area. The second cross-sectional area may be smaller than the first cross-sectional area.

In an embodiment, this disclosure relates to a method of manufacture of a semiconductor device. The method may include establishing a signal conductor layer including a signal channel and a power channel. The power channel may include a first power channel cross-sectional portion and a second power channel cross-sectional portion. The first power channel cross-sectional portion and the signal channel may have a substantially equivalent cross-sectional area. The method may include introducing a first conductor in the power channel having a first cross-sectional area The method may include introducing a second conductor in the signal channel having a second cross-sectional area. The second cross-sectional area may be smaller than the first cross-sectional area.

DETAILED DESCRIPTION

A wiring track on a given plane of a semiconductor device may be designed to lithography and dielectric breakdown specifications. Having signal traces and power traces on a given plane may present challenges due to sometimes favoring low capacitance on signal wires and high capacitance on power wires. Designing may allow for low capacitance on signal wiring tracks and high capacitance on power wiring tracks. Aspects of the disclosure may permit selectively increasing a trench depth without causing negative implications. Aspects of the disclosure may allow design of unique routing wires on a plane of wires of a semiconductor device. Aspects of the disclosure may reduce resistance and increase capacitance on a wiring track adapted to deliver power. Aspects may be achieved with little or no lateral capacitance or signal coupling on a wiring track adapted to carry a signal.

Aspects of the disclosure may include a signal conductor layer. The signal conductor layer may be a metal layer. The signal conductor layer may include channels which may be established. The channels may be trenches. The channels may include a power channel and a signal channel. The power channel may include a first power channel cross-sectional portion and a second power channel cross-sectional portion. The channels, including the channel cross-sectional portions, may include a conductor which may be introduced. Aspects may include a cross-sectional area of the channels and the channel cross-sectional portions. Aspects may also include a cross-sectional area for each conductor.

Figure 1:
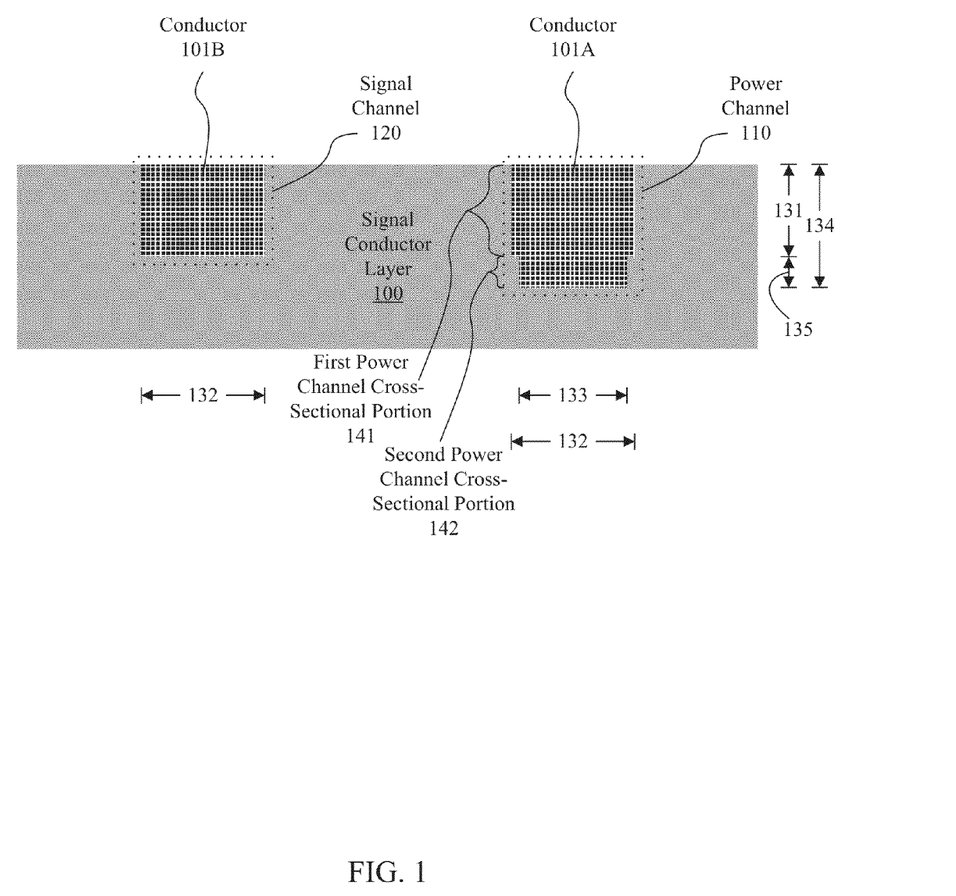
FIG. 1 illustrates a cross-sectional view of a semiconductor device according to an embodiment.

FIG. 1 illustrates a cross-sectional view of a semiconductor device according to an embodiment. The semiconductor device may include a signal conductor layer 100. The signal conductor layer may be a metal layer. The signal conductor layer may include a dielectric material. The signal conductor layer may include an oxide. Particular dielectric materials such as silicon dioxide may be used, though others are considered.

The signal conductor layer 100 may include a channel. A channel may be a trench. The channel may be adapted to hold a wiring track or wire which may be adapted to carry a signal or deliver power. In particular, the signal conductor layer 100 may include a power channel 110. The power channel 110 may be a trench. The power channel 110 may include a first power channel cross-sectional portion 141 and a second power channel cross-sectional portion 142, each power channel cross-sectional portion may be a trench. The first power channel cross-sectional portion 141 may have a cross-sectional height 131 and a cross-sectional width 132. A cross-sectional area of the first power channel cross-sectional portion 141 may be the product of the cross-sectional height 131 and the cross-sectional width 132. The second power channel cross-sectional portion 142 may have a cross-sectional height 135 and a cross-sectional width 133. A cross-sectional area of the second power channel cross-sectional portion 142 may be the product of the cross-sectional height 135 and the cross-sectional width 133. A cross-sectional area of the power channel 110 may be the sum of the cross-sectional area of the first power channel cross-sectional portion 141 and the cross-sectional area of the second power channel cross-sectional portion 142. The power channel 110 may include a conductor 101A which may be adapted to deliver power. A first cross-sectional area of the conductor 101A in the power channel 110 may be the sum of the product of the cross-sectional height 131 and the cross-sectional width 132 and the product of the cross-sectional height 135 and the cross-sectional width 133.

Also, the signal conductor layer 100 may include a signal channel 120. The signal channel 120 may be a trench. The signal channel 120 may have the cross-sectional height 131 and the cross-sectional width 132. A cross-sectional area of the signal channel 120 may be the product of the cross-sectional height 131 and the cross-sectional width 132. The cross-sectional area of the first power channel cross-sectional portion 141 may be substantially equivalent to the cross-sectional area of the signal channel 120. A substantially equivalent area may be an area of a first particular cross-section within ten percent of an area of a second particular cross-section. The signal channel 120 may include a conductor 101B which may be adapted to carry a signal. A second cross-sectional area of the conductor 101B in the signal channel 120 may be the product of the cross-sectional height 131 and a cross-sectional width 132. The second cross-sectional area of the conductor 101B in the signal channel 120 may be smaller than the first cross-sectional area of the conductor 101A in the power channel 110. Aspects described may reduce resistance and increase capacitance on a wiring track adapted to deliver power. Aspects may be achieved with little or no lateral capacitance or signal coupling on a wiring track adapted to carry a signal.

In embodiments, the cross-sectional area of the second power channel cross-sectional portion may be at least ten percent of the cross-sectional area of the first power channel cross-sectional portion. In embodiments, the cross-sectional area of the second power channel cross-sectional portion may be no more than thirty percent of the cross-sectional area of the first power channel cross-sectional portion. In embodiments, the second cross-sectional area may be at least seventy percent of the first cross-sectional area. In embodiments, the second cross-sectional area may be no more than ninety-five percent of the first cross-sectional area. In embodiments, a cross-sectional width of the second power channel cross-sectional portion may be at least eighty percent of a cross-sectional width of the first power channel cross-sectional portion. In embodiments, a cross-sectional height of the second power channel cross-sectional portion may be at least ten percent of a cross-sectional height of the first power channel cross-sectional portion. In embodiments, a cross-sectional height of the second power channel cross-sectional portion may be no more than sixty percent of a cross-sectional height of the first power channel cross-sectional portion. A variety of cross-sectional area, width, and height relationships are considered, including but not limited to the embodiments described above.

Figure 2:
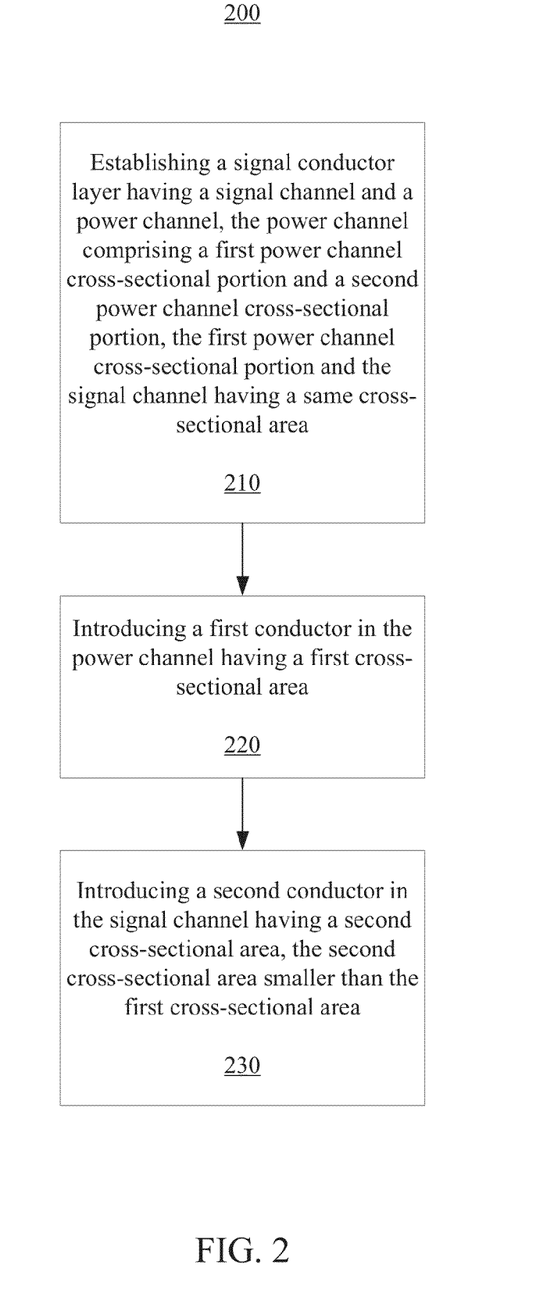
FIG. 2 is a flow chart showing an operation to manufacture a semiconductor device according to an embodiment.

FIG. 2 is a flow chart showing an operation 200 to manufacture a semiconductor device according to an embodiment. At block 210, operation 200 may include establishing a signal conductor layer having a signal channel and a power channel, the power channel comprising a first power channel cross-sectional portion and a second power channel cross-sectional portion, the first power channel cross-sectional portion and the signal channel having a substantially equivalent cross-sectional area. A substantially equivalent area may be an area of a first particular cross-section within ten percent of an area of a second particular cross-section. At block 220, operation 200 may include introducing a first conductor in the power channel having a first cross-sectional area. At block 230, operation 200 may include introducing a second conductor in the signal channel having a second cross-sectional area, the second cross-sectional area smaller than the first cross-sectional area. Aspects described may reduce resistance and increase capacitance on a wiring track adapted to deliver power. Aspects may be achieved with little or no lateral capacitance or signal coupling on a wiring track adapted to carry a signal. In addition to the described, other embodiments having fewer steps, more steps, or different steps are contemplated. Also, some embodiments may perform some or all of the steps in FIG. 2 in a different order.

Figure 3A:
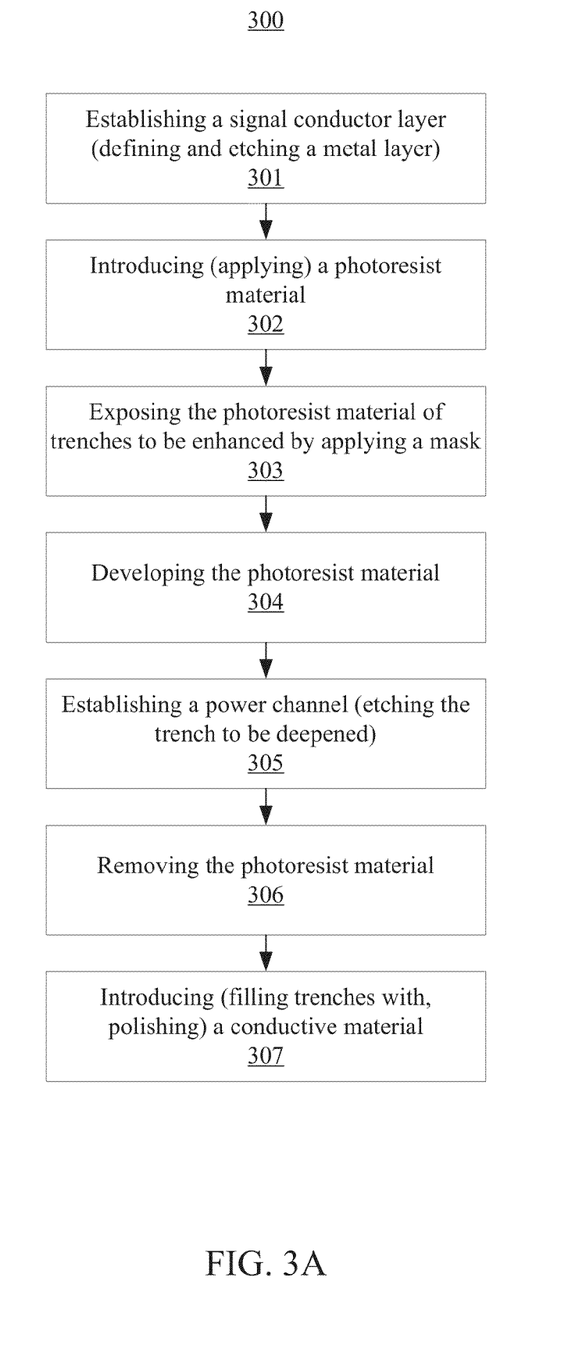
FIG. 3A is a flow chart showing an operation to manufacture a semiconductor device according to an embodiment.

FIG. 3A is a flow chart showing an operation 300 to manufacture a semiconductor device according to an embodiment. At block 301, operation 300 may include establishing a signal conductor layer. At block 302, operation 300 may include introducing a photoresist material. At block 303, operation 300 may include exposing the photoresist material of trenches to be enhanced by applying a mask. At block 304, operation 300 may include developing the photoresist material. At block 305, operation 300 may include establishing a power channel. Aspects of the power channel may reduce resistance and increase capacitance. At block 306, operation 300 may include removing the photoresist material. At block 307, operation 300 may include introducing a conductive material. In addition to the described, other embodiments having fewer steps, more steps, or different steps are contemplated. Also, some embodiments may perform some or all of the steps in FIG. 3A in a different order.

Figure 3B:
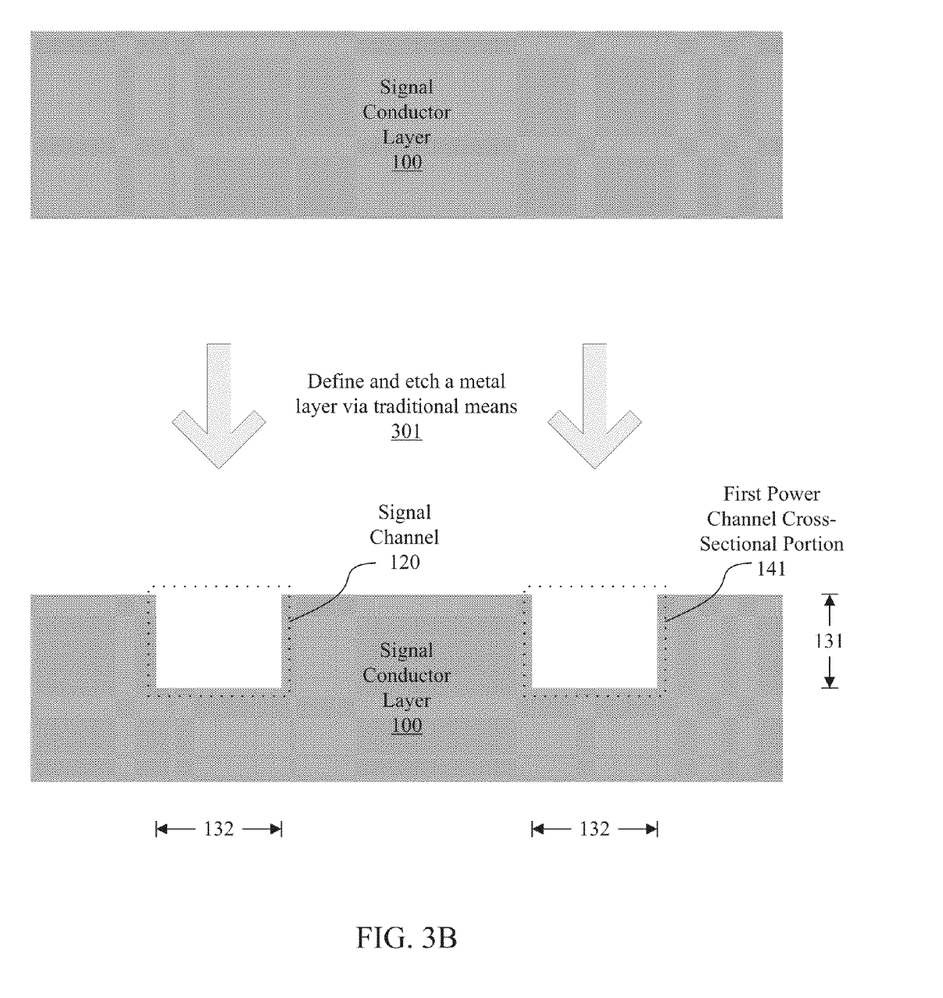
FIG. 3B illustrates an etching of the first power channel cross-sectional portion and the signal channel in the signal conductor layer according to an embodiment.

FIGS. 3B, 3C, 3D, 3E, 3F, 3G, 3H each illustrate a cross-sectional view of a semiconductor device according to an embodiment. FIGS. 3B, 3C, 3D, 3E, 3F, 3G, 3H each illustrate a "before and after" view of operation 300 at each block of FIG. 3A according to an embodiment. FIG. 3B illustrates an etching of the first power channel cross-sectional portion 141 and the signal channel 120 in the signal conductor layer 100 according to an embodiment. The first power channel cross-sectional portion 141 and the signal channel 120 may each have the cross-sectional height 131 and the cross-sectional width 132.

Figure 3C:
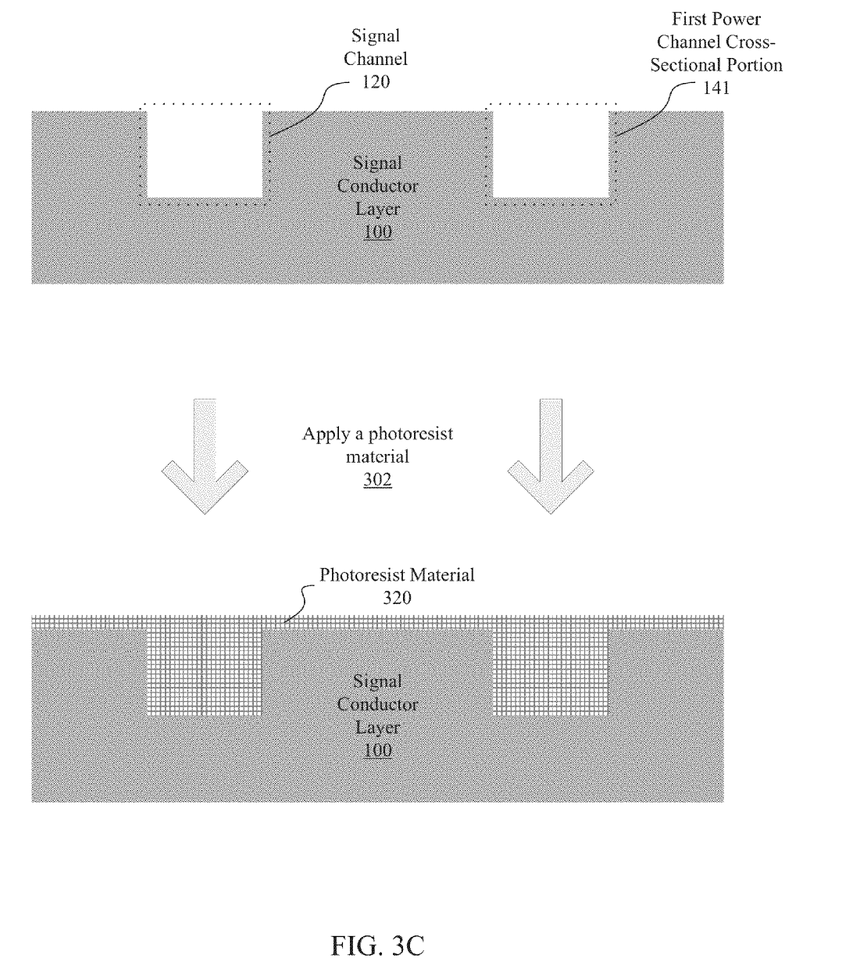
FIG. 3C illustrates an applying of a photoresist material to the semiconductor device according to an embodiment.
Figure 3D:
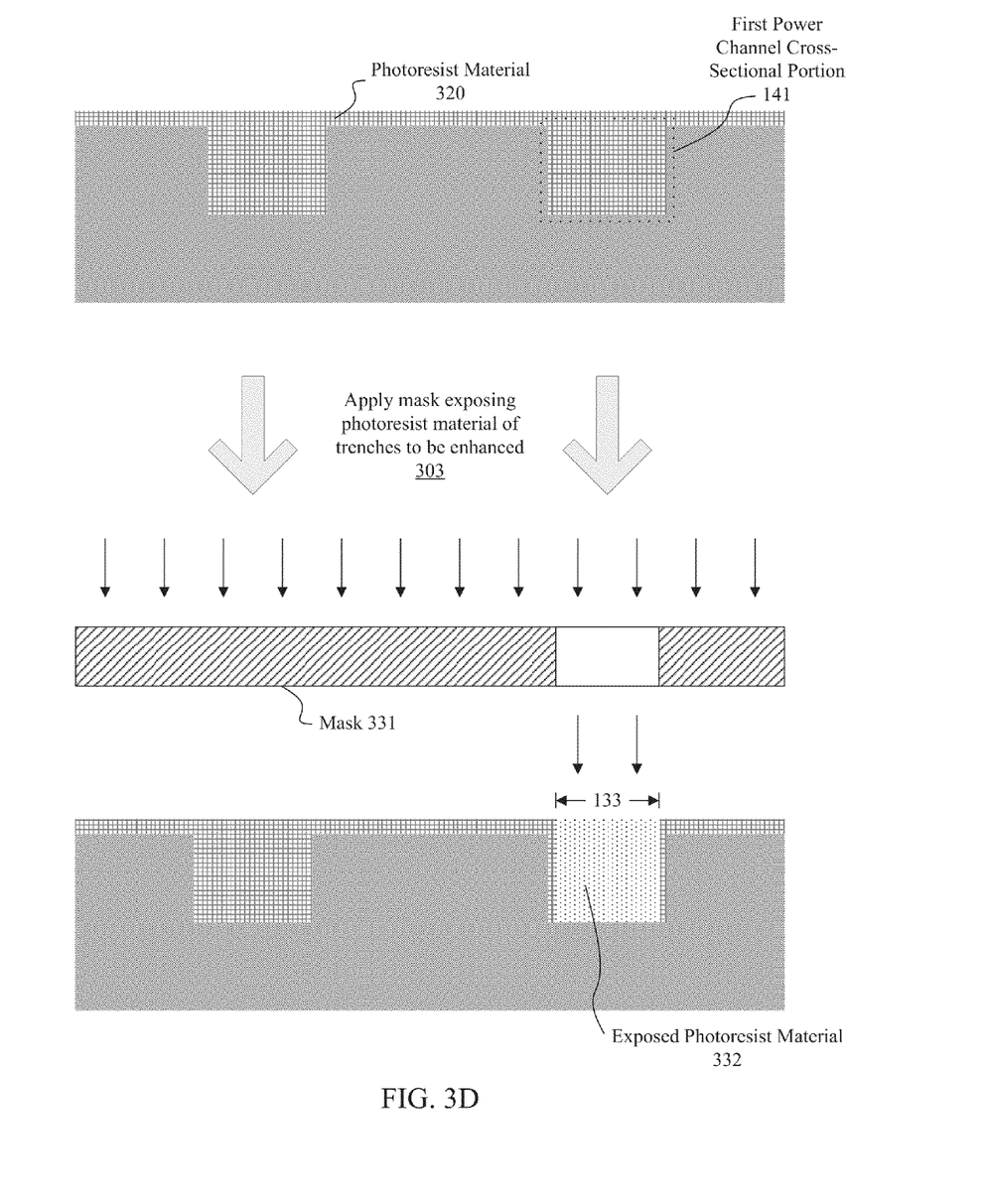
FIG. 3D illustrates an exposing of the photoresist material according to an embodiment.

FIG. 3C illustrates an applying of a photoresist material 320 to the semiconductor device according to an embodiment. FIG. 3D illustrates an exposing of the photoresist material 320 of most of the first power channel cross-sectional portion 141 which is a trench to be enhanced. The cross-sectional width 133 may be the width of the exposure. Mask 331 may be applied during a photolithographic process. After the photolithographic process, exposed photoresist material 332 may remain.

Figure 3E:
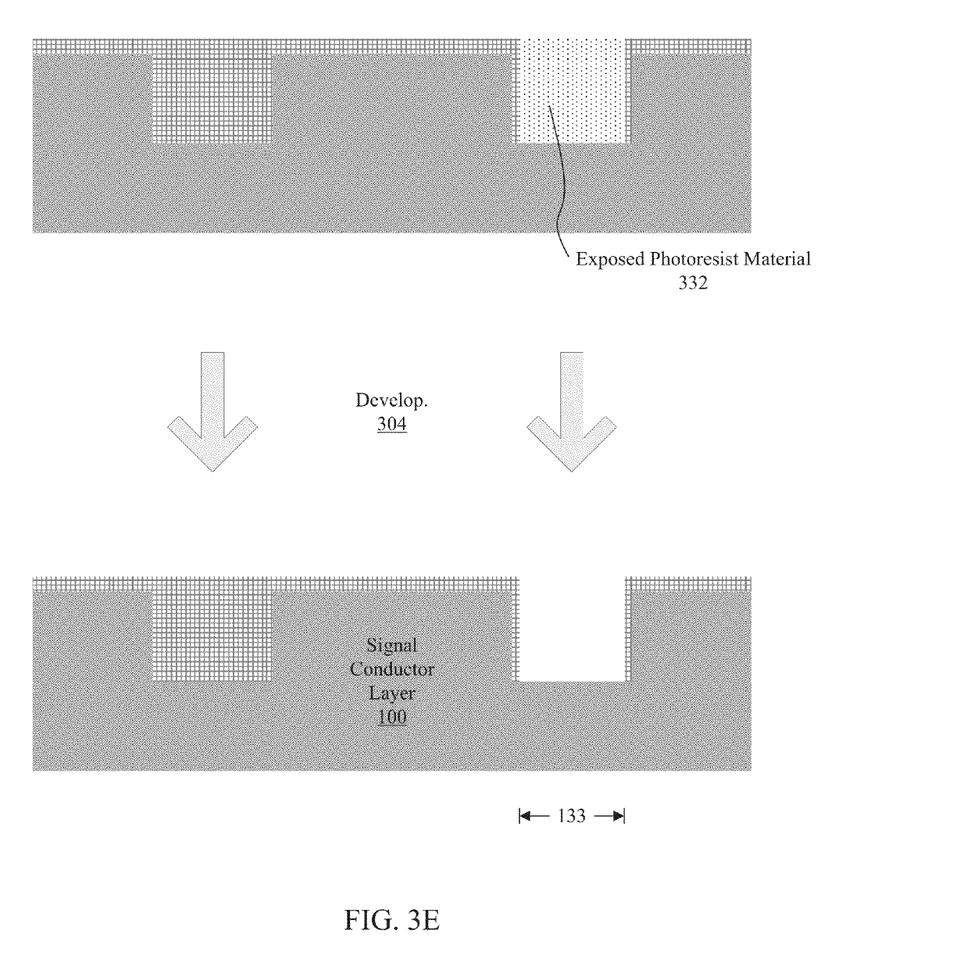
FIG. 3E illustrates development of the exposed photoresist material according to an embodiment.
Figure 3F:
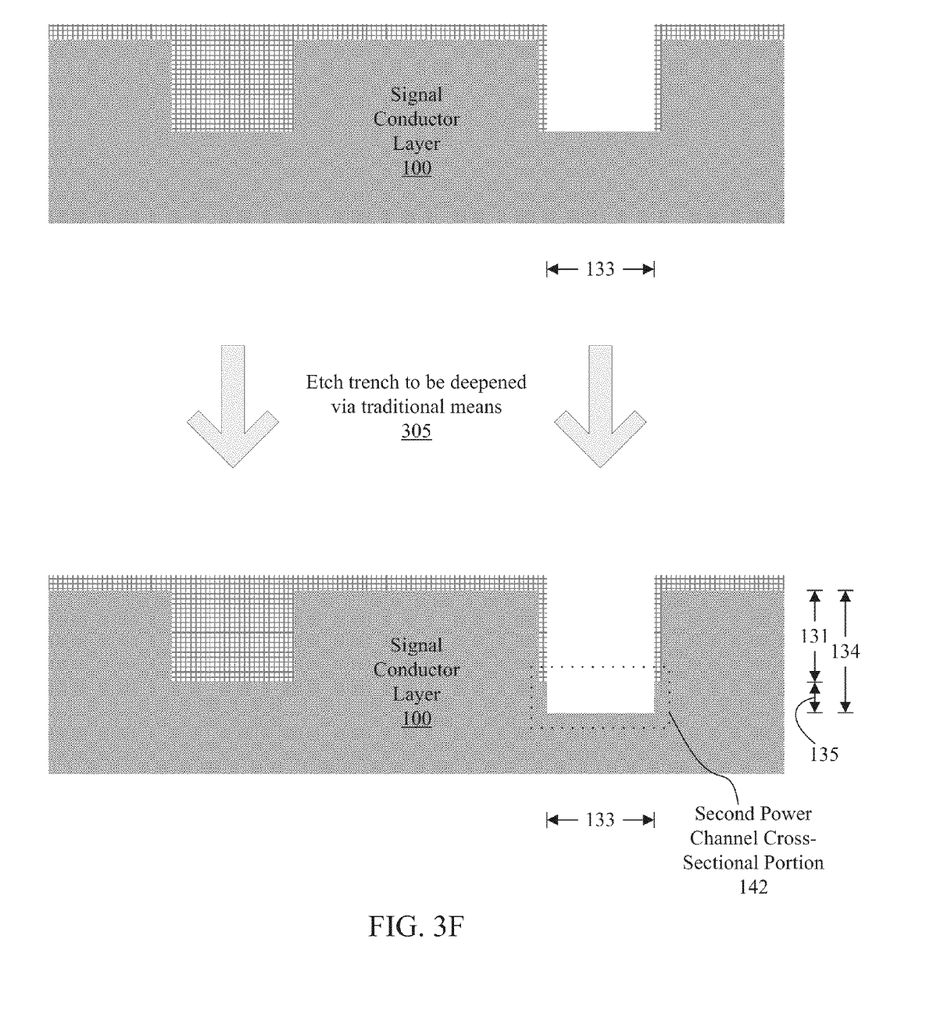
FIG. 3F illustrates etching a trench that may be the second power channel cross-sectional portion according to an embodiment.
Figure 3G:
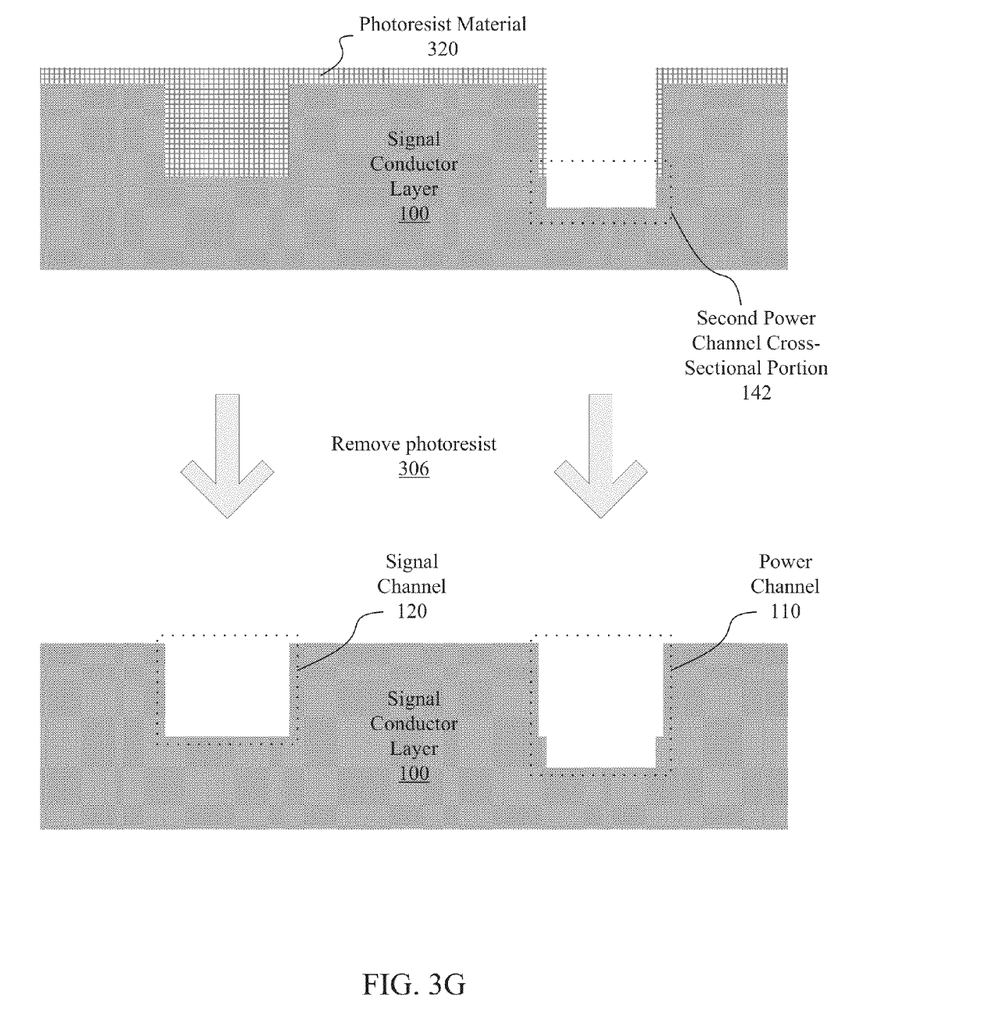
FIG. 3G illustrates a removal of the photoresist material 320 according to an embodiment.
Figure 3H:
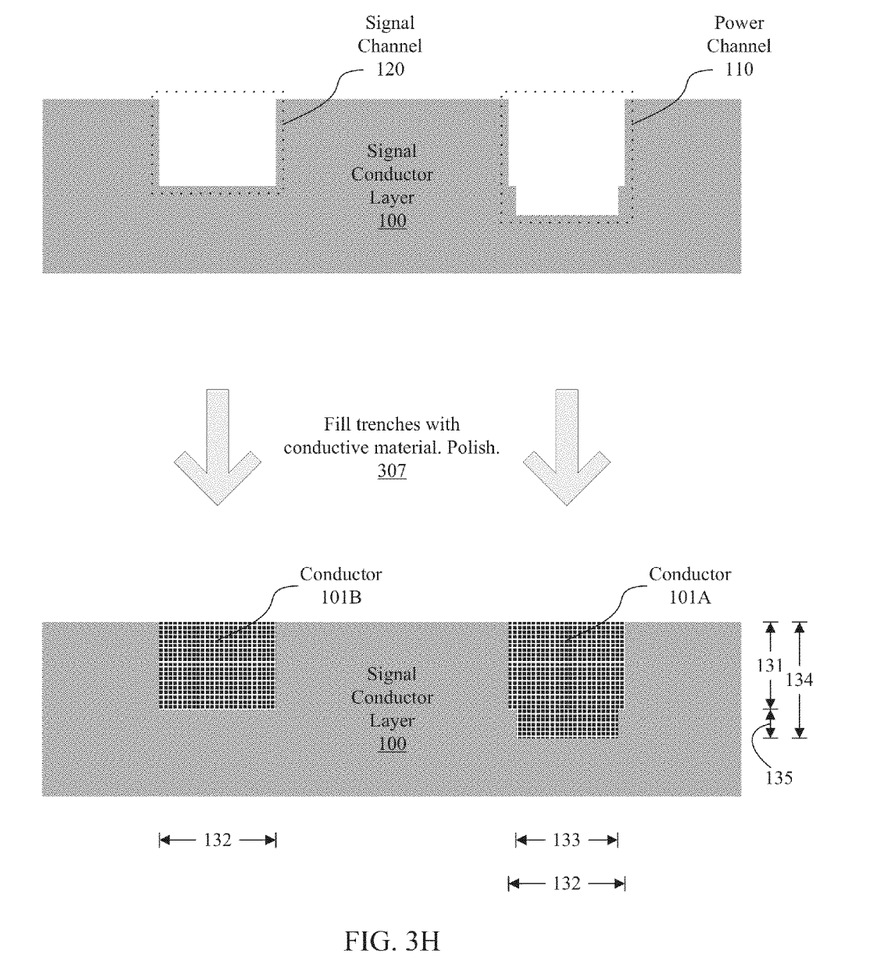
FIG. 3H illustrates a conductor filling the trenches according to an embodiment.

FIG. 3E illustrates development of the exposed photoresist material 332, leaving a cross-sectional width 133 without photoresist material. FIG. 3F illustrates etching a trench that may be the second power channel cross-sectional portion 142 with the cross-sectional height 135 and the cross-sectional width 133. FIG. 3G illustrates a removal of the photoresist material 320. FIG. 3H illustrates a conductor 101 (i.e., 101A in the power channel 110, 101B in the signal channel 120) filling the trenches. The second cross-sectional area of the conductor 101B in the signal channel 120 may be smaller than the first cross-sectional area of the conductor 101A in the power channel 110. The finished product may be the same as FIG. 1.

In the foregoing, reference is made to various embodiments. It should be understood, however, that this disclosure is not limited to the specifically described embodiments. Instead, any combination of the described features and elements, whether related to different embodiments or not, is contemplated to implement and practice this disclosure.

Many modifications and variations may be apparent to those of ordinary skill in the art without departing from the scope and spirit of the described embodiments. Furthermore, although embodiments of this disclosure may achieve advantages over other possible solutions or over the prior art, whether or not a particular advantage is achieved by a given embodiment is not limiting of this disclosure. Thus, the described aspects, features, embodiments, and advantages are merely illustrative and are not considered elements or limitations of the appended claims except where explicitly recited in a claim(s).

What is claimed is:

1. A semiconductor device, comprising:
a signal conductor layer having adjacent channels for wiring tracks, the adjacent channels including:
a signal channel and a power channel, the power channel comprising a first power channel cross-sectional portion and a second power channel cross-sectional portion, the first power channel cross-sectional portion and the signal channel having a substantially equivalent cross-sectional area;
a first conductor in the power channel having a first cross-sectional area; and
a second conductor in the signal channel having a second cross-sectional area, the second cross-sectional area smaller than the first cross-sectional area.

2. The semiconductor device of claim 1, wherein the cross-sectional area of the second power channel cross-sectional portion is at least ten percent of the cross-sectional area of the first power channel cross-sectional portion.

3. The semiconductor device of claim 1, wherein the cross-sectional area of the second power channel cross-sectional portion is no more than thirty percent of the cross-sectional area of the first power channel cross-sectional portion.

4. The semiconductor device of claim 1, wherein the second cross-sectional area is at least seventy percent of the first cross-sectional area.

5. The semiconductor device of claim 1, wherein the second cross-sectional area is no more than ninety-five percent of the first cross-sectional area.

6. The semiconductor device of claim 1, wherein a cross-sectional width of the second power channel cross-sectional portion is at least eighty percent of a cross-sectional width of the first power channel cross-sectional portion.

7. The semiconductor device of claim 1, wherein a cross-sectional height of the second power channel cross-sectional portion is at least ten percent of a cross-sectional height of the first power channel cross-sectional portion.

8. The semiconductor device of claim 1, wherein a cross-sectional height of the second power channel cross-sectional portion is no more than sixty percent of a cross-sectional height of the first power channel cross-sectional portion.

9. The semiconductor device of claim 1, wherein the signal conductor layer has an insulator bordering at least three edges of the signal channel and bordering at least three edges of the power channel.

10. The semiconductor device of claim 1, wherein the first conductor is bordered on at least three edges by an insulator and the second conductor is bordered on at least three edges by the insulator.

11. The semiconductor device of claim 9, wherein the insulator is an oxide, wire resistance in the signal channel is greater than wire resistance in the power channel, wire capacitance in the power channel is greater than wire capacitance in the signal channel, and the power channel is configured to achieve signal integrity related to lateral capacitance with respect to the signal channel.

12. The semiconductor device of claim 9, wherein the insulator beneath both the signal channel and the power channel includes neither the signal channel nor the power channel being extended fully through the insulator.

13. The semiconductor device of claim 9, wherein a cross-sectional height of the signal conductor layer exceeds a cross-sectional height of the power channel which exceeds a cross-sectional height of the signal channel.

14. The semiconductor device of claim 9, wherein the insulator borders at least three edges of the second power channel cross-sectional portion.

15. The semiconductor device of claim 1, wherein the signal conductor layer includes a plane of wires.

16. The semiconductor device of claim 1, wherein the first conductor in the power channel is a first wiring track and the second conductor in the signal channel is a second wiring track.

17. The semiconductor device of claim 1, wherein the signal channel is adapted to carry a signal across the signal conductor layer and the power channel is adapted to deliver power across the signal conductor layer.

18. The semiconductor device of claim 1, wherein the first power channel cross-sectional portion and the signal channel have a substantially equivalent cross-sectional width.

19. The semiconductor device of claim 1, wherein the second power channel cross-sectional portion is beneath the first power channel cross-sectional portion.

20. The semiconductor device of claim 1, wherein the second power channel cross-sectional portion has one side that borders the first power channel cross-sectional portion for a cross-sectional width of the second power channel cross-sectional portion without the one side bordering an insulator.

* * * * *